(12) United States Patent
Nakajima

(10) Patent No.: US 8,130,131 B2
(45) Date of Patent: Mar. 6, 2012

(54) INTERPOLATING A/D CONVERTER

(75) Inventor: Yuji Nakajima, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 142 days.

(21) Appl. No.: 12/763,439

(22) Filed: Apr. 20, 2010

(65) Prior Publication Data

US 2010/0271249 A1 Oct. 28, 2010

(30) Foreign Application Priority Data

Apr. 22, 2009 (JP) ................................. 2009-103982

(51) Int. Cl.
*H03M 1/34* (2006.01)
(52) U.S. Cl. ........................................ 341/158; 341/155
(58) Field of Classification Search .................. 341/155, 341/156, 158, 159
See application file for complete search history.

(56) References Cited

U.S. PATENT DOCUMENTS

| | | | | |
|---|---|---|---|---|
| 2001/0048383 A1* | 12/2001 | Nagaraj | ........................ | 341/159 |
| 2004/0189386 A1* | 9/2004 | Nishimura | ..................... | 330/253 |
| 2007/0188366 A1* | 8/2007 | Makigawa et al. | ........... | 341/155 |
| 2009/0179787 A1* | 7/2009 | Naka et al. | ..................... | 341/155 |
| 2010/0231430 A1* | 9/2010 | Nakajima | ..................... | 341/155 |
| 2010/0277357 A1* | 11/2010 | Ko et al. | ........................ | 341/155 |

FOREIGN PATENT DOCUMENTS

JP 2009-021667 1/2009

* cited by examiner

*Primary Examiner* — Howard Williams
(74) *Attorney, Agent, or Firm* — Young & Thompson

(57) ABSTRACT

Provided is an interpolating A/D converter including a reference voltage generation circuit, an analog signal input circuit, a preamplifier group including a plurality of preamplifiers, and an interpolation circuit including a plurality of resistors. Reference voltages from the reference voltage generation circuit and an analog signal from the analog signal input circuit are input to the preamplifier group. The interpolation circuit outputs an interpolation signal by interpolating output signals of the preamplifier group. The preamplifiers amplify a differential voltage when a differential voltage between the analog signal and the reference voltages is smaller than a specified value, and the current flow of which is stopped when it is larger than the specified value. The plurality of resistors are connected in series between the adjacent amplifiers.

8 Claims, 18 Drawing Sheets

US 8,130,131 B2

INTERPOLATING A/D CONVERTER

INCORPORATION BY REFERENCE

This application is based upon and claims the benefit of priority from Japanese patent application No. 2009-103982, filed on Apr. 22, 2009, the disclosure of which is incorporated herein in its entirety by reference.

BACKGROUND

1. Field of the Invention

The present invention relates to an interpolating A/D converter.

2. Description of Related Art

An A/D (Analog/Digital) converter that includes a plurality of comparators is generally used for converting an analog signal to a digital signal. In order to increase the resolution of signal conversion in such an A/D converter, a large number of amplifiers for driving comparators need to be placed in the previous stage of the comparators. As a result, a circuit overhead becomes larger. This raises problems such as a decrease in the yield of the A/D converter and a failure to reduce the cost of a semiconductor chip that incorporates the A/D converter.

To address such problems, a generally used technique is to reduce the number of amplifiers by interpolating output signals between adjacent amplifiers with use of an interpolation circuit, such as an interpolating A/D converter disclosed in Japanese Unexamined Patent Application Publication No. 2009-21667.

FIG. 16 is a block diagram showing a configuration of a typical interpolating A/D converter. Referring to FIG. 16, the interpolating A/D converter includes a reference voltage generation circuit 401, an analog signal input circuit 402, a preamplifier group 403, an interpolation circuit 404, and a comparator group 405.

In the reference voltage generation circuit 401, a resistor ladder 401a that includes 2n (n is an integer of one or greater) number of resistors 401b is connected between a maximum reference voltage VRT and a minimum reference voltage VRB. The reference voltage generation circuit 401 generates (2n+1) kinds of reference voltages Vr and outputs them to the preamplifier group 403. In FIG. 16, the respective reference voltages Vr are denoted by the reference symbols $Vr_{-n}$ to $Vr_n$ in order to distinguish among them.

The analog signal input circuit 402 outputs an analog signal AIN to the preamplifier group 403.

The preamplifier group 403 is made up of (2n+1) number of preamplifiers AMP4. In FIG. 16, the respective preamplifiers AMP4 are denoted by the reference symbols $AMP4_{-n}$ to $AMP4_n$ in order to distinguish among them. The preamplifiers AMP4 output amplified signals of the analog signal AIN and the reference voltages Vr to the interpolation circuit 404 and the comparator group 405.

The interpolation circuit 404 includes 8n number of resistors 404a. The interpolation circuit 404 interpolates output signals of the adjacent preamplifiers AMP4 and outputs interpolation signals to the comparator group 405.

The comparator group 405 includes (4n+1) number of comparators 405a. The comparator group 405 compares the signals output from the preamplifiers AMP4 with the interpolation signals output from the interpolation circuit 404 and outputs signals to an encoder (not shown) or the like.

In this configuration, it is assumed that a voltage of the analog signal AIN and the reference voltage $Vr_0$ are equal in $AMP4_0$.

Next, a configuration of the preamplifier AMP4 is described. FIG. 17 is a block diagram showing a configuration of the preamplifier AMP4. Referring to FIG. 17, between a ground voltage GND and a power supply voltage VDD, a tail current source 43, a differential pair 41 composed of Nch (N-channel) transistors 41a and 41b, and load resistors 42a and 42b are connected sequentially from the side of the ground voltage GND.

A gate voltage VINP4 of the Nch transistor 41a is a voltage of the analog signal AIN. A gate voltage VINN4 of the Nch transistor 41b is the reference voltage Vr.

Further, a voltage between the Nch transistor 41a and the load resistor 42a is an output voltage VOUTN4. A voltage between the Nch transistor 41b and the load resistor 42b is an output voltage VOUTP4.

An operation of the preamplifier AMP4 is described hereinbelow. In the preamplifier AMP4, the differential pair 41 operates according to the gate voltages VINP4 and VINN4. A current I flows through the preamplifier AMP4. The current I divides into a current Ia that flows through the Nch transistor 41a and the load resistor 42a and a current Ib that flows through the Nch transistor 41b and the load resistor 42b. Thus, current I=Ia+Ib flows between the power supply voltage VDD and the ground voltage GND. The values of Ia and Ib are determined depending on a differential voltage $\Delta V4$ ($\Delta V4$=VINP4−VINN4; the same applies below).

Further, the tail current source 43 keeps the current I at a constant level. Thus, the same level of current flows through the respective preamplifiers $AMP4_n$ to $AMP4_{-n}$.

SUMMARY

It has now been discovered that the above-described interpolating A/D converter has the following problem.

FIG. 18 is a graph showing a relationship between a differential voltage $\Delta V4$ of the preamplifier AMP4 and a current flowing through the preamplifier AMP4 in the above-described interpolating A/D converter where n=14. Referring to FIG. 18, a flowing current is constant in the respective preamplifiers AMP4. On the other hand, the differential voltage $\Delta V4$ varies in a stepwise fashion. Generally, the operation of the preamplifier is saturated when the input voltage exceeds a certain level. The range in which the preamplifier AMP4 operates without saturation is $VLL \leq \Delta V4 \leq VUL$ shown in FIG. 18.

Specifically, the preamplifiers AMP4 in the range of $\Delta V4 < VLL$ and $\Delta V4 > VUL$ are practically irrelevant to the characteristics of the interpolating A/D converter. Nonetheless, a current keeps flowing through those preamplifiers AMP4, which raises a problem that power consumption is large in the interpolating A/D converter shown in FIG. 16.

Further, the interpolation circuit 404 only has the function that merely interpolates signals output from the preamplifiers AMP4. Thus, it does not make a significant contribution to the characteristics of signals that are directly output from the preamplifiers AMP4 without through the resistors 404a, which are outputs of $AMP4_n$ to $AMP4_{-n}$. Accordingly, even when resistance values of the resistors 404a change, there is no significant contribution to the characteristics of the interpolating A/D converter.

An exemplary aspect of the present invention is an interpolating A/D converter which includes an analog signal input circuit that receives an analog signal from outside, a reference voltage generation circuit that includes a resistor ladder connected between a maximum reference voltage and a minimum reference voltage and generates reference voltages different from one another, an amplifier group that receives the analog signal and the reference voltages, or a first input signal and a second input signal generated based on the analog signal and the reference voltages, and an interpolation circuit that interpolates output signals from the amplifier group and outputs an interpolation signal, wherein the amplifier group includes a plurality of amplifiers that amplify a differential voltage when a differential voltage between the analog signal and the reference voltages or between the first input signal and the second input signal is smaller than a specified value, and the current flow of which is stopped when the differential voltage is larger than the specified value, and the interpolation circuit includes a plurality of resistors that are connected in series between the adjacent amplifiers.

The interpolating A/D converter according to the exemplary aspect of the present invention performs signal amplification according to input signals if a differential voltage of the input signals of the amplifiers is smaller than a specified value. On the other hand, a current flow through the amplifiers is stopped if a differential voltage of the input signals is larger than the specified value. It is thereby possible to reduce power consumption during the amplification. It is also possible to adjust the gain of the amplifiers by combining the amplifiers and the interpolation circuit.

According to the exemplary aspect of the present invention described above, it is possible to provide an interpolating A/D converter capable of reducing power consumption during amplification and adjusting the gain of amplifiers.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Exemplary embodiments of the present invention are described hereinafter with reference to the drawings.

First Exemplary Embodiment

Figure 1:
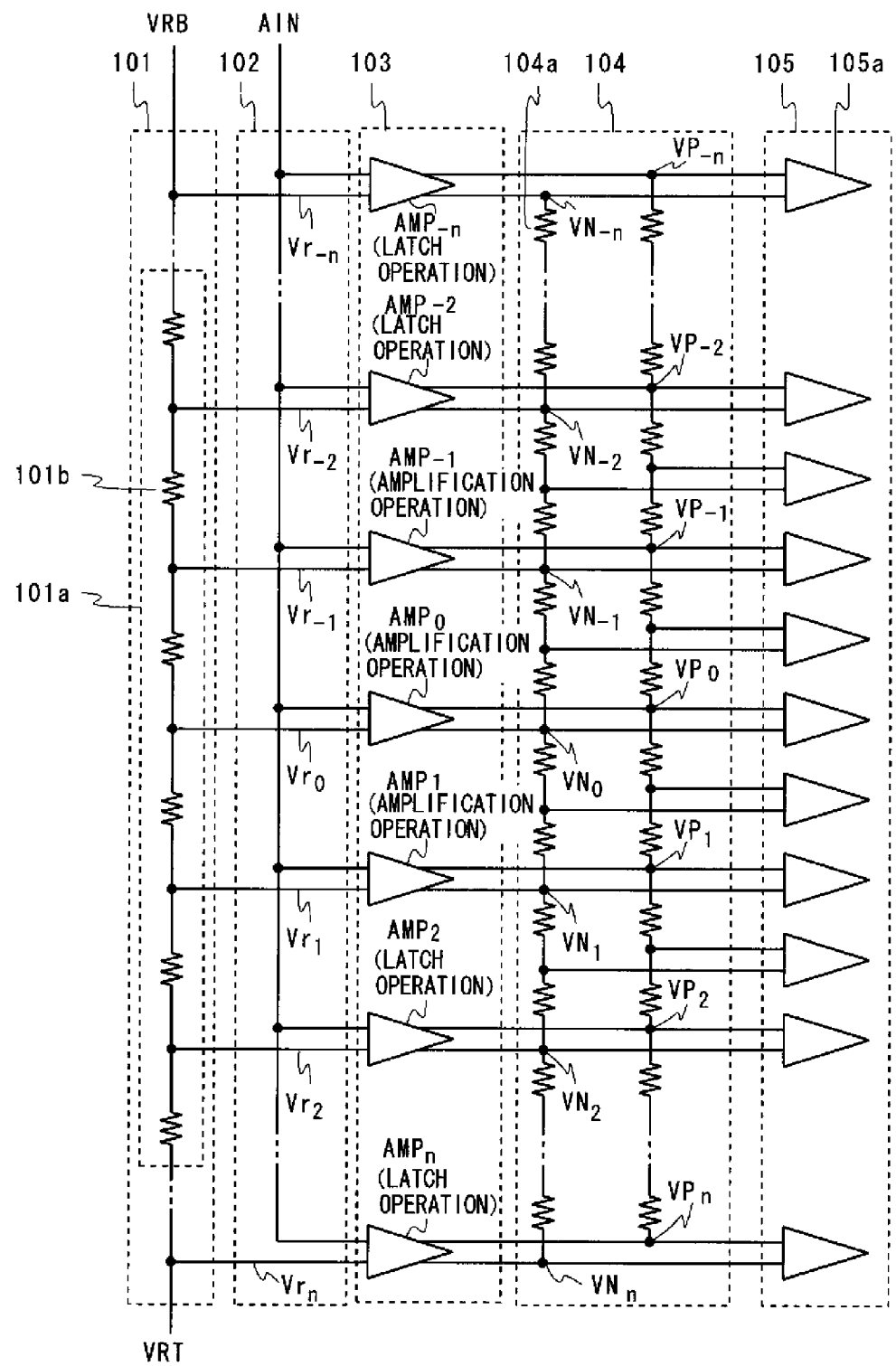
FIG. 1 is a block diagram of an interpolating A/D converter according to a first exemplary embodiment.

FIG. 1 is a block diagram showing a configuration of an interpolating A/D converter according to a first exemplary embodiment. Referring to FIG. 1, the interpolating A/D converter includes a reference voltage generation circuit 101, an analog signal input circuit 102, a preamplifier group 103, an interpolation circuit 104, and a comparator group 105.

In the reference voltage generation circuit 101, a resistor ladder 101a is connected between a maximum reference voltage VRT and a minimum reference voltage VRB. The resistor ladder 101a includes 2n (n is an integer of one or greater) number of resistors 101b. The reference voltage generation circuit 101 generates (2n+1) kinds of reference voltages Vr. Then, the reference voltage generation circuit 101 outputs the generated reference voltages Vr to the preamplifier group 103. In FIG. 1, the respective reference voltages Vr are denoted by the reference symbols $Vr_{-n}$ to $Vr_n$ in order to distinguish among them.

The analog signal input circuit 102 outputs an analog signal AIN to the preamplifier group 103.

The preamplifier group 103 is made up of (2n+1) number of preamplifiers AMP. In FIG. 1, the respective preamplifiers AMP are denoted by the reference symbols $AMP_{-n}$ to $AMP_n$ in order to distinguish among them. The preamplifiers AMP output amplified signals of the analog signal AIN and the reference voltages Vr to the interpolation circuit 104 and the comparator group 105.

The interpolation circuit 104 includes 8n number of resistors 104a. The interpolation circuit 104 outputs interpolation signals generated by interpolating output signals of the adjacent preamplifiers AMP to the comparator group 105.

The comparator group 105 includes (4n+1) number of comparators 105a. The comparator group 105 compares the signals output from the preamplifiers AMP with the interpolation signals and outputs signals to an encoder (not shown) or the like.

In this configuration, it is assumed that a voltage of the analog signal AIN and the reference voltage $Vr_0$ are equal in $AMP_0$.

Figure 2:
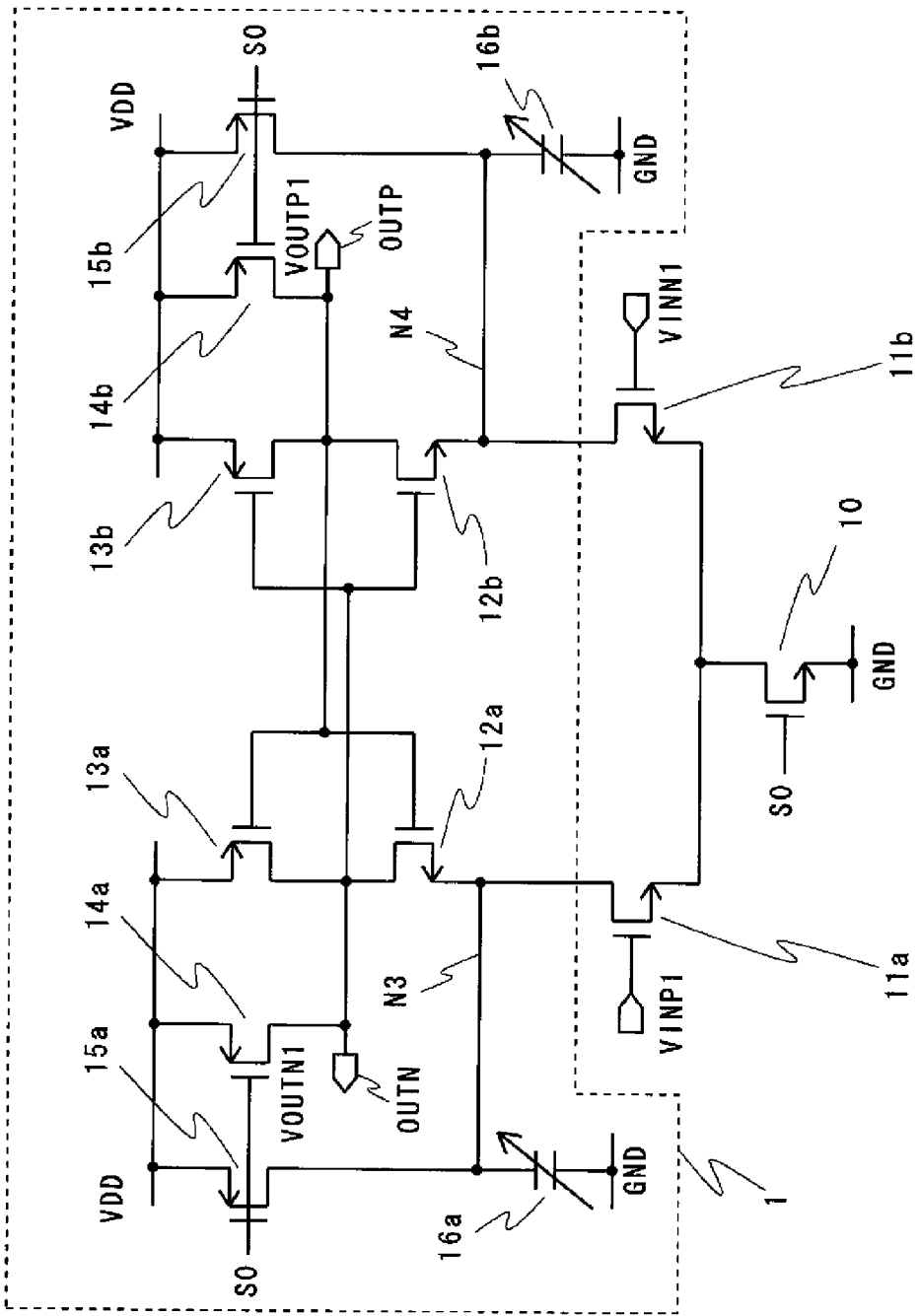
FIG. 2 is a block diagram of a preamplifier according to the first exemplary embodiment.

Next, a configuration of each preamplifier AMP is described. FIG. 2 is a block diagram showing a configuration of the preamplifier AMP. Referring to FIG. 2, in the preamplifier AMP, the source of a switch 10 being an Nch transistor is connected to a ground voltage GND. An amplification signal S0 is input to the gate of the switch 10.

The drain of the switch 10 is connected to the sources of Nch transistors 11a and 11b. The drains of the Nch transistors 11a and 11b are connected to an amplification circuit 1. A gate voltage VINP1 of the Nch transistor 11a is a voltage of the analog signal AIN. A gate voltage VINN1 of the Nch transistor 11b is the reference voltage Vr.

The amplification circuit 1 includes a latch circuit made up of Nch transistors 12a and 12b and Pch (P-channel) transistors 13a and 13b. The drains of the Nch transistor 12a and the Pch transistor 13a are connected through a node at a potential equal to an output voltage VOUTN1. The drains of the Nch transistor 12b and the Pch transistor 13b are connected through a node at a potential equal to an output voltage VOUTP1.

The drain of the Nch transistor 11a is connected to the source of the Nch transistor 12a. The drain of the Nch transistor 11b is connected to the source of the Nch transistor 12b. The sources of the Pch transistors 13a and 13b are connected to a power supply voltage VDD.

Further, the gates of the Nch transistors 12a and the Pch transistors 13a and the drain of a Pch transistor 14b are connected to an output terminal OUTP that outputs the output voltage VOUTP1. The gates of the Nch transistors 12b and the Pch transistors 13b and the drain of a Pch transistor 14a are connected to an output terminal OUTN that outputs the output voltage VOUTN1.

The sources of the Pch transistor 14a and a Pch transistor 15a are connected to the power supply voltage VDD. The drain of the Pch transistor 15a is connected to a node N3 and also connected to the ground voltage GND through a variable capacitor 16a.

The sources of the Pch transistor 14b and a Pch transistor 15b are connected to the power supply voltage VDD. The drain of the Pch transistor 15b is connected to a node N4 and also connected to the ground voltage GND through a variable capacitor 16b.

The amplification signal S0 is input to the gates of the Pch transistors 14a, 14b, 15a and 15b.

The variable capacitors 16a and 16b are placed to adjust an input referred offset. Thus, the variable capacitors 16a and 16b may be eliminated when there is no need to adjust an input referred offset.

Figure 3:
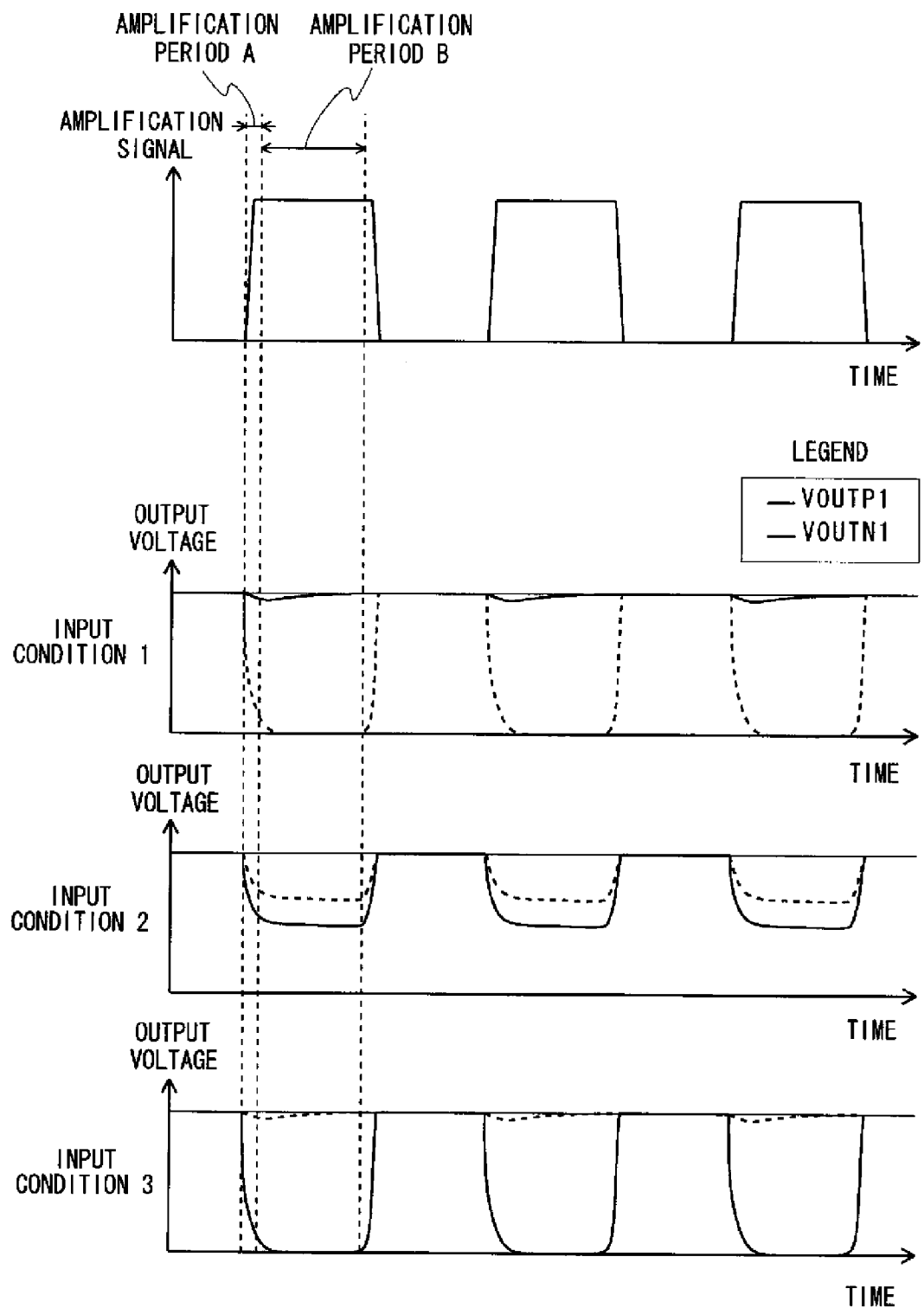
FIG. 3 is a graph showing an amplification of the preamplifier according to the first exemplary embodiment.

An operation of the preamplifier AMP is described hereinafter. The preamplifier AMP turns ON when the amplification signal S0 is H level and operates amplification of the input signals. FIG. 3 is a graph showing an amplification of the preamplifier AMP. The preamplifier AMP turns OFF when the amplification signal S0 is L level. The amplification is divided into an amplification period A which is a transitional period until reaching a stable amplification state after the amplification signal S0 transitions to H level and the amplification is started and an amplification period B during which the stable amplification state is maintained, as shown in FIG. 3.

Figure 4A:
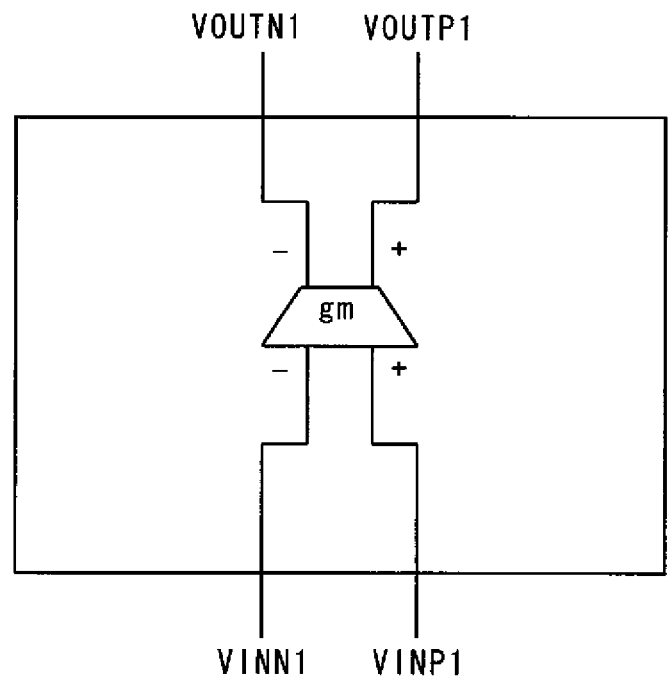
FIG. 4A is a block diagram showing an operation of the preamplifier according to the first exemplary embodiment.

FIG. 4A is a block diagram showing an operation of the preamplifier AMP. In the amplification period A, the preamplifier AMP operates as a transconductor cell gm that is connected between the inputs VINP1 and VINN1 and the outputs VOUTP1 and VOUTN1, as shown in FIG. 4A. Thus, the preamplifier AMP outputs an amplified signal of the input signals.

Figure 4B:
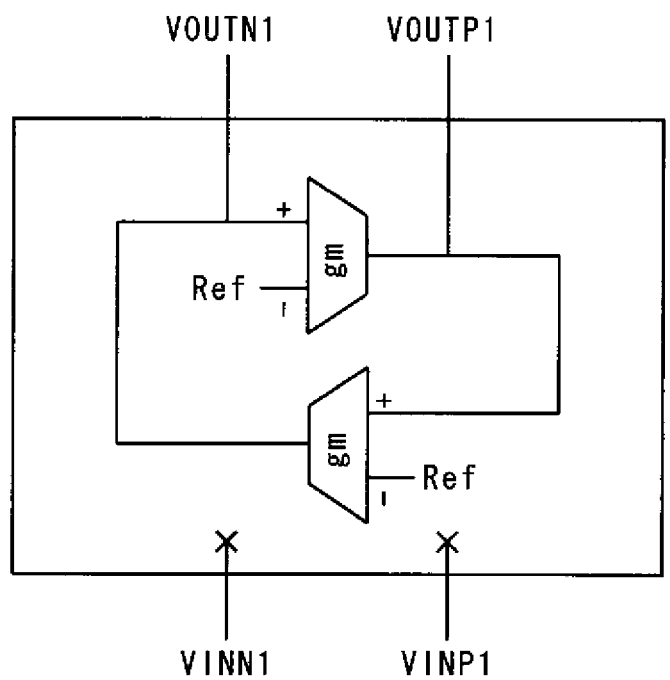
FIG. 4B is a block diagram showing an operation of the preamplifier according to the first exemplary embodiment.

FIG. 4B is a block diagram showing an operation of the preamplifier AMP. In the amplification period B, the preamplifier AMP operates as two transconductor cells gm that are connected between the output voltages VOUTP1 and VOUTN1 and input/output signals with each other, as shown in FIG. 4B. Thus, the preamplifier AMP further amplifies the signal generated during the amplification period A.

In the above-described transconductor cell gm, a transconductance value is maximized when the input signal has a voltage at an intermediate level between the power supply voltage VDD and the ground voltage GND.

Specifically, when the amplification signal S0 is L level, the switch 10 turns OFF. Further, the Pch transistors 14a, 14b, 15a and 15b turn ON, and the output voltages VOUTP1 and VOUTN1 are pulled up to the power supply voltage VDD.

When the amplification signal S0 transitions to H level, the amplification period A is started first. When the amplification signal S0 transitions from L level to H level, the switch 10 turns ON, and the Pch transistors 14a, 14b, 15a and 15b turn OFF. On the other hand, the Nch transistors 11a and 11b turn ON according to the gate voltages VINP1 and VINN1, respectively.

Further, immediately after the amplification signal S0 transitions from L level to H level, the Nch transistors 12a and 12b and the Pch transistors 13a and 13b are OFF. The output voltages VOUTP1 and VOUTN1 that have been pulled up to the power supply voltage VDD start to drop by the current Ia flowing through the transistor 11a and the current Ib flowing through the transistor 11b. The current Ia and the current Ib are determined depending on a gate differential voltage ΔV (ΔV=VINP1−VINN1; the same applies below).

Then, the voltages applied to the gates of the Nch transistors 12a and 12b and the Pch transistors 13a and 13b also drop.

Consequently, the output voltages VOUTP1 and VOUTN1 become the voltages amplified according to the gate differential voltage ΔV.

Figure 5:
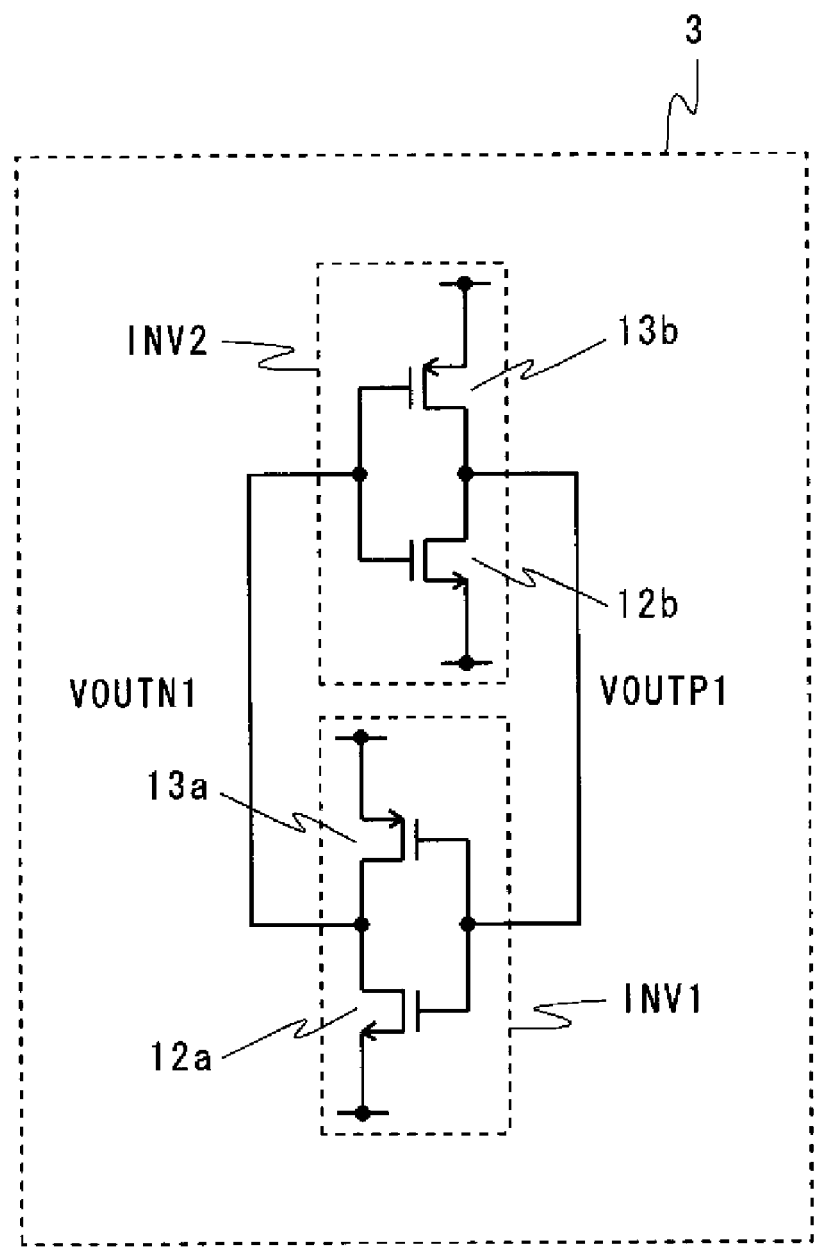
FIG. 5 is a block diagram when the preamplifier according to the first exemplary embodiment operates as an inverter.

Then, when the transition is made from the amplification period A to the amplification period B, the nodes N3 and N4 are stabilized at the ground voltage. Thus, the preamplifier AMP operates as an amplification circuit 3 that includes an inverter INV1 and an inverter INV2 as shown in FIG. 5. The amplified signal generated during the amplification period A is thereby further amplified by the amplification circuit 3. In the amplification circuit 3 of FIG. 5, the inverter INV1 is made up of the Nch transistor 12a and the Pch transistor 13a that are connected between the output voltages VOUTP1 and VOUTN1. The inverter INV2 is made up of the Nch transistor 12b and the Pch transistor 13b that are connected between the output voltages VOUTP1 and VOUTN1.

It is dividable into the following three input conditions 1 to 3 (FIG. 3) depending on whether an absolute value |ΔV| of the gate differential voltage ΔV is within a specified value V0 (V0>0) or not. The operation of the preamplifier AMP is different in each input condition.

The input condition 1 is the case where ΔV>V0. As shown in FIG. 3, the amplification circuit 3 performs a latch operation as a result of amplification by the preamplifier AMP. Specifically, the Nch transistor 12a and the Pch transistor 13b turn ON, and the Nch transistor 12b and the Pch transistor 13a turn OFF. Thus, the preamplifier AMP performs a latch operation, so that the output voltage VOUTP1 is fixed to the power supply voltage VDD. Further, the output voltage VOUTN1 is fixed to the ground voltage GND. In this case, no current flows through the preamplifier AMP because there is a break between the power supply voltage VDD and the ground voltage GND.

The input condition 2 is the case where −V0≦ΔV≦V0. As shown in FIG. 3, the output voltages VOUTP1 and VOUTN1 are amplified between the power supply voltage VDD and the ground voltage GND according to the gate voltages VINP1 and VINN1, respectively. In this case, a current flows through the preamplifier AMP because there is continuity between the power supply voltage VDD and the ground voltage GND.

The input condition 3 is the case where ΔV<−V0. As shown in FIG. 3, the amplification circuit 3 performs a latch operation as a result of amplification by the preamplifier AMP. Specifically, the Nch transistor 12b and the Pch transistor 13a turn ON, and the Nch transistor 12a and the Pch transistor 13b turn OFF. Thus, the preamplifier AMP performs a latch operation, so that the output voltage VOUTP1 is fixed to the ground voltage GND. Further, the output voltage VOUTN1 is fixed to the power supply voltage VDD. In this case, no current flows through the preamplifier AMP because there is a break between the power supply voltage VDD and the ground voltage GND.

In sum, the preamplifier AMP having the above configuration functions as a latch circuit and no current flows therethrough when a differential voltage between the voltage of the analog signal AIN and the reference voltage Vr is larger than a specified value. On the other hand, when it is within the specified value, a current flows through the preamplifier AMP, and the preamplifier AMP operates the amplification according to the input signals.

Figure 6:
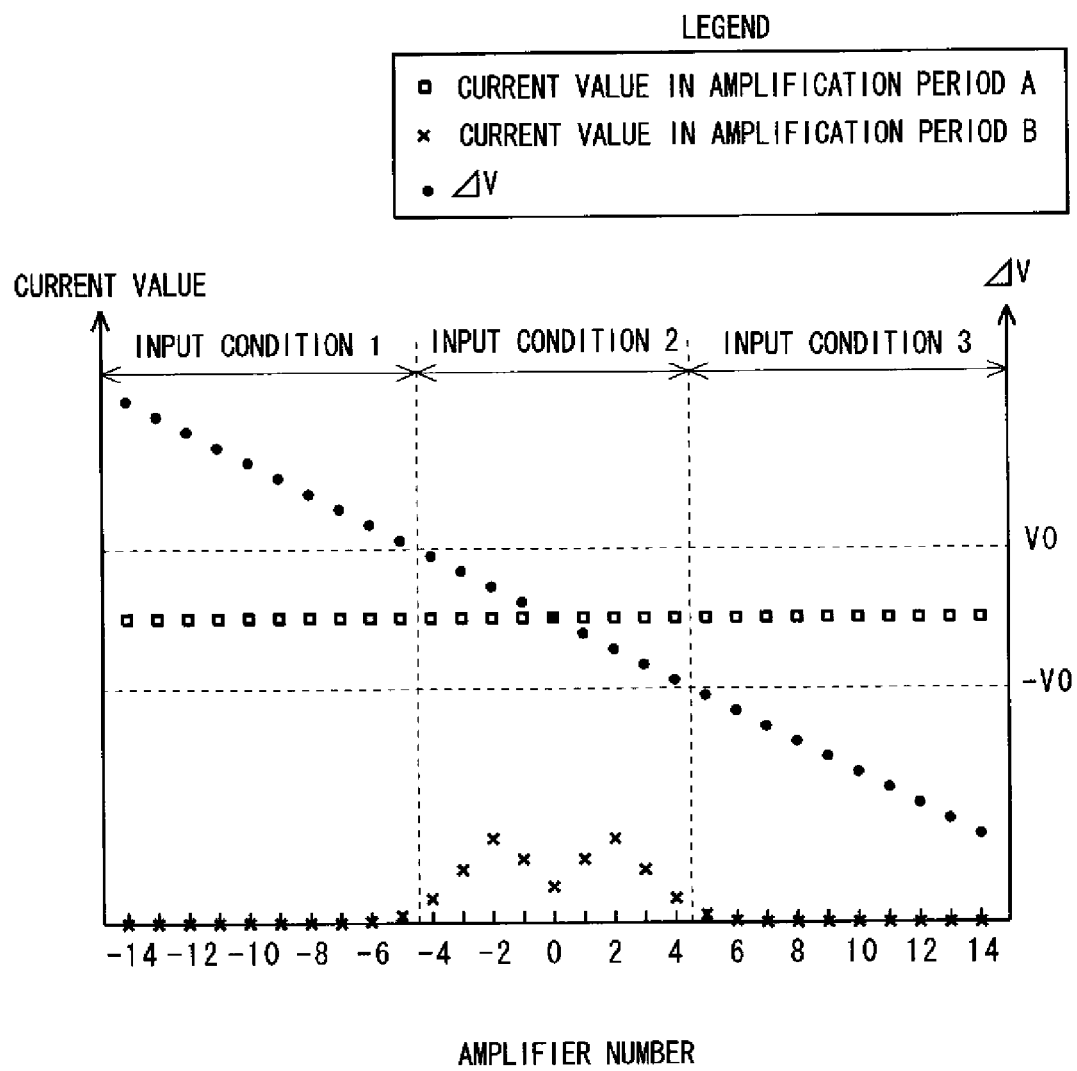
FIG. 6 is a graph showing a relationship between input signals and a current flowing through the preamplifier according to the first exemplary embodiment.

FIG. 6 is a graph showing a relationship between the gate differential voltage ΔV and the current flowing through the preamplifier AMP in the case where n=14. As shown in FIG. 6, the gate differential voltage ΔV varies in a stepwise fashion. During the amplification period A, a flowing current is constant for any of the preamplifiers AMP. During the amplification period B, on the other hand, a current flows only through the preamplifier AMP in the range of the input condition 2.

This is described with reference to FIG. 1. It is assumed, for example, that the preamplifiers $AMP_{-1}$ to $AMP_1$ satisfy the input condition 2. In this case, the preamplifiers $AMP_{-1}$ to $AMP_1$ within the range of the input condition 2 centering on the amplifier $AMP_0$ operate the amplification. On the other hand, the preamplifiers $AMP_2$ to $AMP_n$ and $AMP_{-n}$ to $AMP_{-2}$ located outside that range perform the latch operation.

Because the amplification period A is shorter than the amplification period B, it is possible to reduce the power consumption in the interpolating A/D converter by using the preamplifiers AMP in this configuration.

The operation of the preamplifier AMP during the amplification period B and under the input condition 2 is described hereinafter in further detail by using mathematical expressions. A threshold voltage of the Nch transistors 11a, 11b, 12a and 12b and the Pch transistors 13a and 13b is Vt. Further, for simplification of analysis, a β value (Expression 1) of the Nch transistors 11a, 11b, 12a and 12b and the Pch transistors 13a and 13b and an absolute value of Vt are assumed to be equal.

$$\beta = \mu C_{ox} \frac{W}{L} \qquad \text{Expression 1}$$

where μ indicates the mobility of carriers, $C_{ox}$ indicates gate capacitance per unit area, L indicates a channel length, and W indicates a channel width.

It is assumed that the output voltages VOUTP1 of the preamplifiers $AMP_n$ to $AMR_{-n}$ are v(-n) to v(n). Because the circuit shown in FIG. 5 is symmetric and the interpolating A/D converter shown in FIG. 1 is also symmetric about the preamplifier $AMP_0$, the output voltages VOUTN1 are v(n) to v(-n).

Further, a relationship represented by the following Expression 2 is established between the output voltages VOUTP1 and VOUTN1.

$$VOUTP1 + VOUTN1 = VDD \qquad \text{Expression 2}$$

Therefore, v(n)+v(-n)=VDD.

Figure 7:
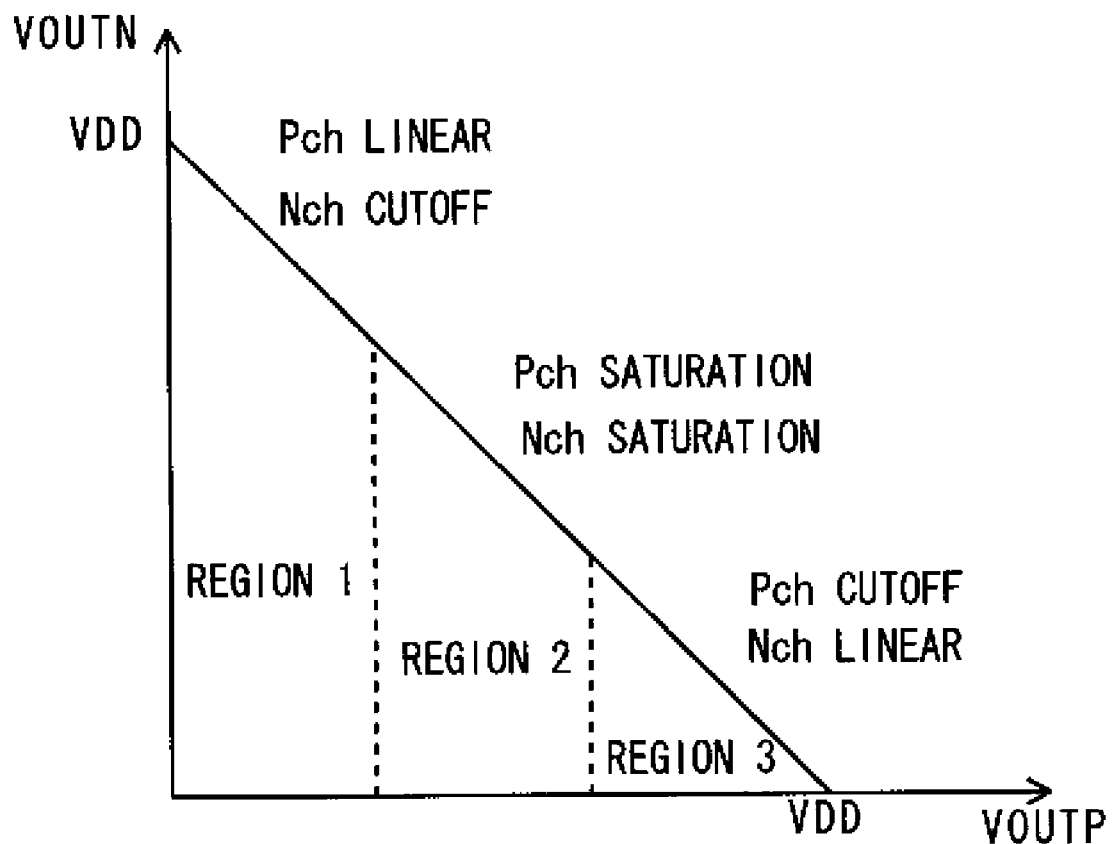
FIG. 7 is a graph showing input/output characteristics when the preamplifier according to the first exemplary embodiment operates as an inverter.

For simplification of analysis, it is assumed that Vt=1/3VDD. Then, the operation of the inverter INV1 can be represented by a mathematical expression, divided into the following three kinds of operating regions. FIG. 7 is a graph showing input/output characteristics of the inverter INV1 shown in FIG. 5.

The operating region 1 is in the case where VOUTP1<1/3VDD, VOUTN1>2/3VDD. In this case, the Nch transistors perform a cut-off operation, and the Pch transistors perform a linear operation.

The operating region 2 is in the case where 1/3VDD<VOUTP1<2/3VDD, 1/3VDD<VOUTN1<2/3VDD. In this case, the Nch transistors and the Pch transistors both perform a saturation operation.

The operating region 3 is in the case where VOUTP1>2/3VDD, VOUTN1<1/3VDD. In this case, the Nch transistors perform a linear operation, and the Pch transistors perform a cutoff operation.

An output current Iout1 that is output from the inverter INV1 in the respective operating regions is represented as follows by using a square law expression of a CMOS (Complementary Metal Oxide Semiconductor) transistor which is represented by Expressions 3 and 4.

If $V_{GS}$ is a voltage between gate and source, and $V_{DS}$ is a voltage between drain and source, the output current Iout1 is represented by the following Expression 3 in the case of the saturation region ($V_{GS}-Vt>V_{DS}$).

$$Iout1 = \frac{\beta}{2}(V_{GS}-Vt)^2 \qquad \text{Expression 3}$$

Further, the output current Iout1 is represented by the following Expression 4 in the case of the linear region ($V_{GS}-Vt<V_{DS}$).

$$Iout1 = \beta\left[(V_{GS}-Vt)V_{DS} - \frac{1}{2}V_{DS}^2\right] \qquad \text{Expression 4}$$

The output current Iout1 in the operating region 1 is represented by Expression 5.

$$\begin{aligned} Iout1 &= \beta\left[(VDD-VOUTP1-Vt)(VDD-2VOUTN1) - \frac{1}{2}(VOUTN1)^2\right] \\ &= \beta\ VOUTP1\left(VDD - \frac{3}{2}VOUTP1 - Vt\right) \\ &= \beta\ VOUTP1\left(VDD - \frac{3}{2}VOUTP1\right) \end{aligned} \qquad \text{Expression 5}$$

The output current Iout 1 in the operating region 2 is represented by Expression 6.

$$\begin{aligned} Iout1 &= \frac{\beta}{2}(VDD-VOUTP1-Vt)^2 - \frac{\beta}{2}(VOUTP1-Vt)^2 \\ &= \frac{\beta}{2}(VDD-2VOUTP1)(VDD-2Vt) \\ &= -\beta(VDD-2Vt)\left(VOUTP1 - \frac{VDD}{2}\right) \end{aligned} \qquad \text{Expression 6}$$

The output current Iout1 in the operating region 3 is represented by Expression 7.

$$Iout1 = -\beta\left[(VOUTP1 - Vt)VOUTN1 - \frac{1}{2}VOUTN1^2\right]$$
$$= -\beta(VDD - VOUTP1)\left(-\frac{5}{6}VDD + \frac{3}{2}VOUTP1\right)$$

Expression 7

Further, for simplification of analysis, Expressions 5 to 7 are approximated to a single cubic equation represented by Expression 8.

$$Iout1 = -\beta\frac{8}{9}\sqrt{3}\frac{VOUTP1}{VDD}\left(VOUTP1 - \frac{1}{2}VDD\right)(VOUTP1 - VDD)$$

Expression 8

Figure 8:
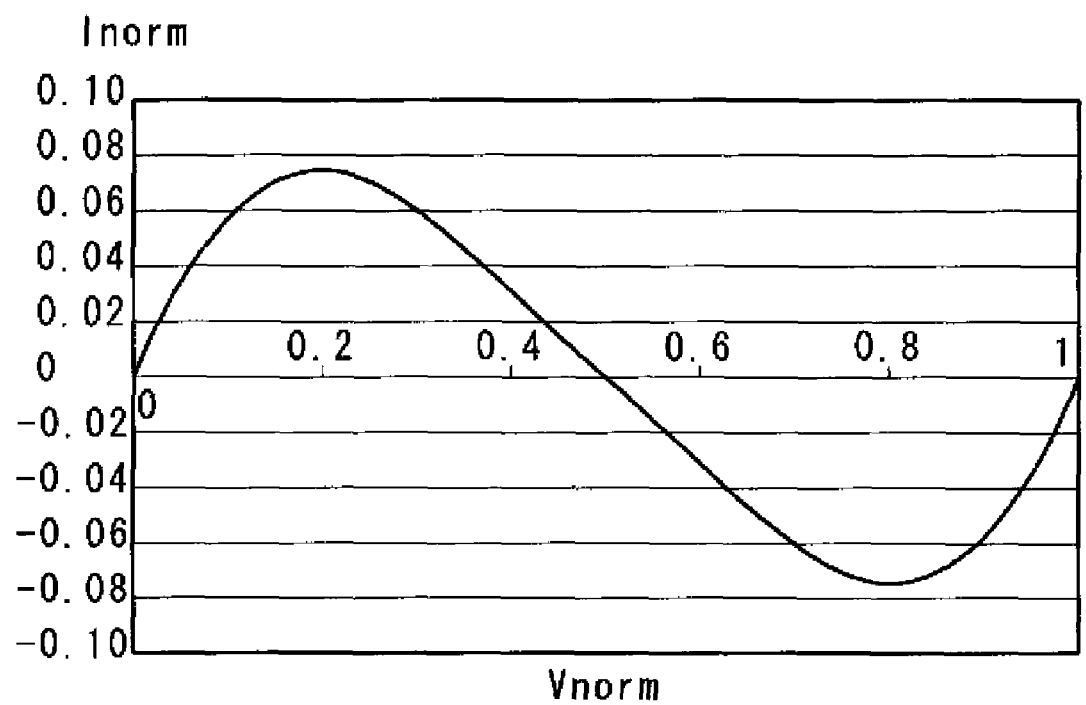
FIG. 8 is a graph showing a current output from an inverter INV1 according to the first exemplary embodiment.

FIG. 8 is a graph showing a calculation result of Expression 8. The vertical axis of FIG. 8 indicates a normalized output current Inorm (Iout1/($\beta$VDD$^2$)). The horizontal axis of FIG. 8 indicates a normalized output voltage Vnorm (VOUTP1/VDD). As shown in FIG. 8, Inorm and Vnorm are in a substantially linear relationship in the operating region 2.

Further, the output current Iout2 that is output from the inverter INV2 can be calculated in the same manner, and a graph in the same form is obtained.

As described above, in the operating region 2, the output voltage VOUTP1 and the output current Iout1 flowing from the output terminal OUTN have a linear relationship. The output voltage VOUTP1 is a voltage that is amplified depending on the gate differential voltage $\Delta V$ during the amplification period A. Thus, the gate differential voltage $\Delta V$ and the current flowing from the output terminal OUTN have a linear relationship. Note that the output voltages VOUTP1 and VOUTN1 have the relationship represented by the above Expression 2, the gate differential voltage $\Delta V$ and the current flowing from the output terminal OUTP also have a linear relationship. Accordingly, in the operating region 2, the preamplifier AMP has suitable analog characteristics.

Further, the operation of the interpolating A/D converter in the operating region 2 is described hereinbelow. The operation of the preamplifier AMP is simulated by using Expression 8. The voltages of nodes VP$_{-n}$ to VP$_n$ are determined by a product $\beta\cdot R$ of the $\beta$ value and the resistance value R of the resistor 104a. In this example, simulation is performed for the case where $\beta\cdot R$=0.2 and 0.4 where n=15 and the power supply voltage VDD=1[V].

Figure 9:
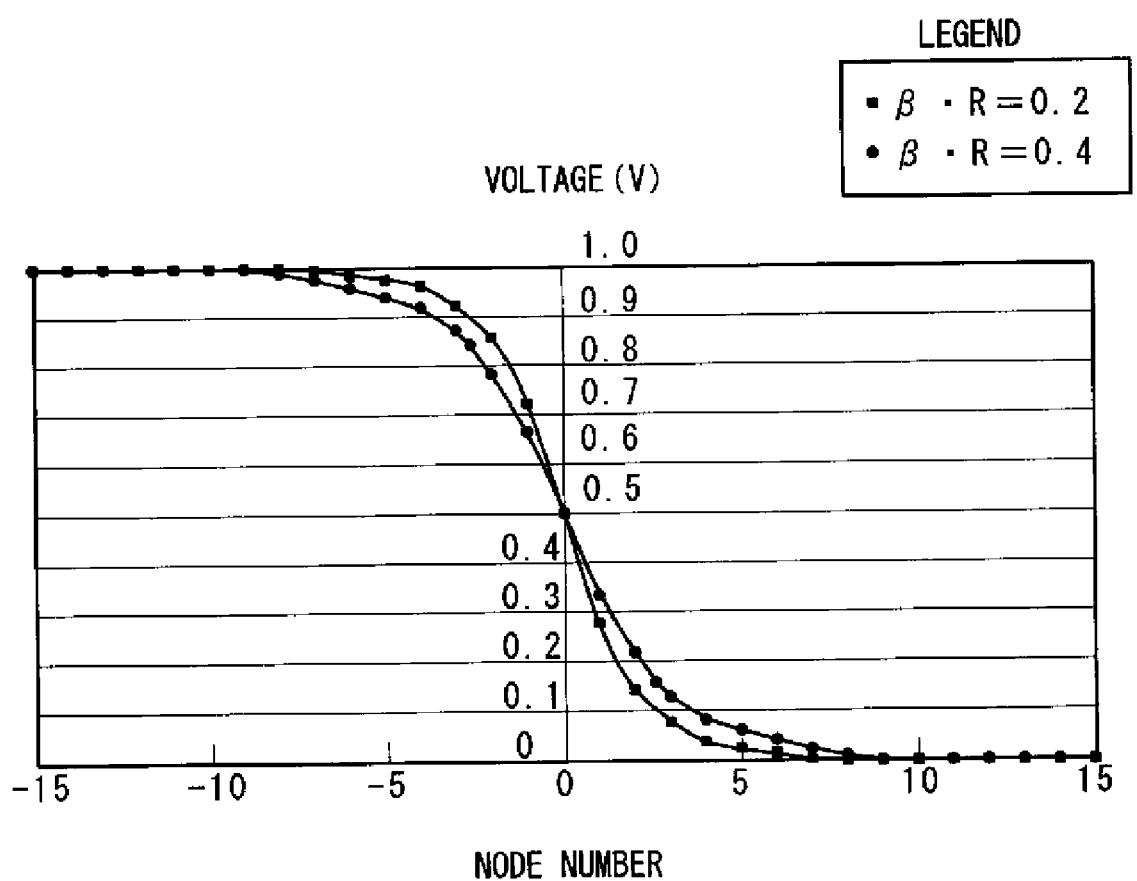
FIG. 9 is a graph showing voltages at nodes of the interpolating A/D converter according to the first exemplary embodiment.

FIG. 9 is a graph showing a simulation result. Referring to FIG. 9, the voltages of the nodes VP$_{-n}$ to VP$_n$ during the amplification period B and in the operating region 2 vary linearly. Further, the rate of change in voltage differs by the value of $\beta\cdot R$. Specifically, the resistor 104a in this configuration has a function of not only interpolating output signals of the preamplifiers AMP but also linearizing a change in the voltages of the nodes VP$_{-n}$ to VP$_n$. Further, by appropriately setting the resistance value R, it is possible to adjust the gain of amplifiers in the interpolating A/D converter. Such characteristics are suitable as a method of obtaining an optimum operation at each frequency when the operating frequency of the A/D converter is changed. Further, the above characteristics can be obtained first by combining the preamplifier AMP and the interpolation circuit 104 according to the exemplary embodiment. The same effect can be achieved for the voltages of the nodes VN$_{-n}$ to VN$_n$.

Second Exemplary Embodiment

Figure 10:
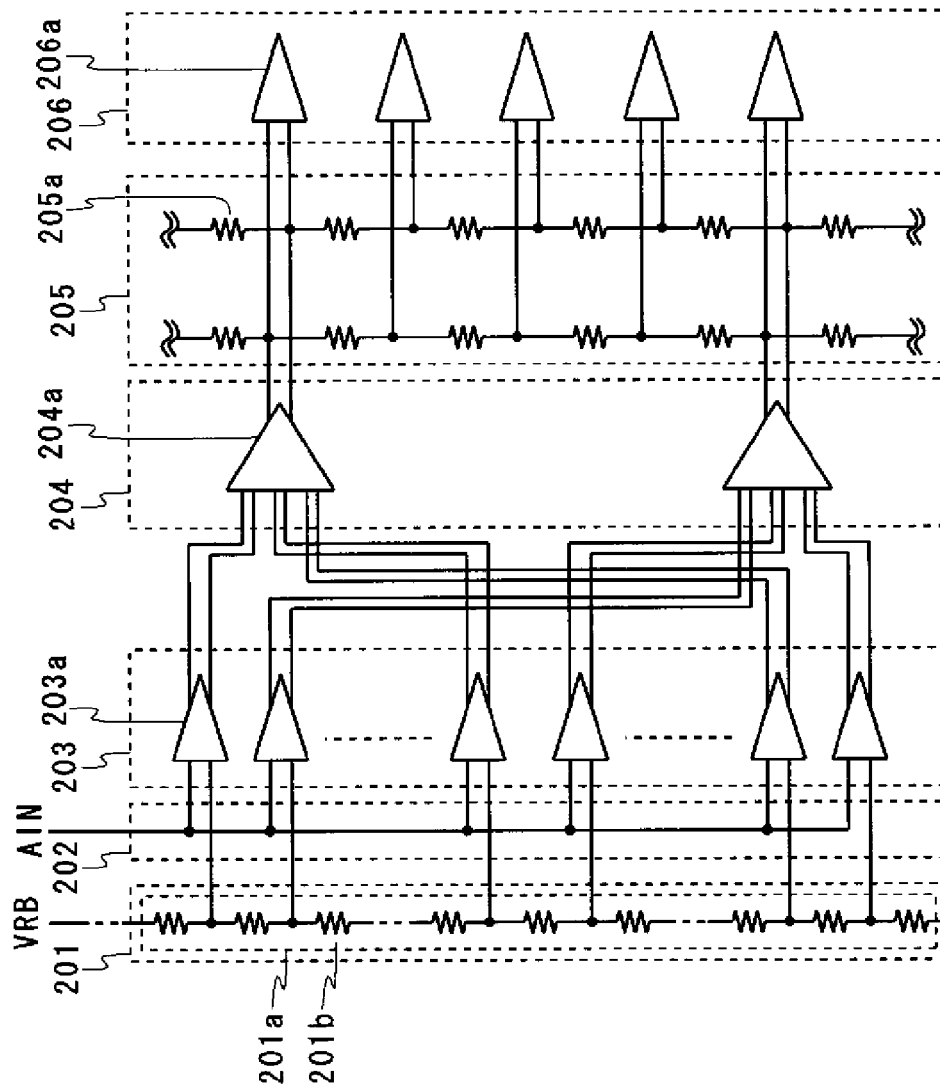
FIG. 10 is a block diagram of an interpolating A/D converter according to a second exemplary embodiment.

A folding-interpolating A/D converter according to a second exemplary embodiment is described hereinbelow. FIG. 10 is a block diagram showing a configuration of a principal part of the folding-interpolating A/D converter according to the exemplary embodiment. Referring to FIG. 10, the folding-interpolating A/D converter includes a reference voltage generation circuit 201, an analog signal input circuit 202, a preamplifier group 203, a folding amplifier group 204, an interpolation circuit 205 and a comparator group 206.

In the reference voltage generation circuit 201, a resistor ladder 201a is connected between a maximum reference voltage VRT and a minimum reference voltage VRB. The resistor ladder 201a includes (3m+2) number of resistors 201b, where m is an integer of one or greater. The reference voltage generation circuit 201 generates 3(m+1) kinds of reference voltages and outputs them to the preamplifier group 203.

The analog signal input circuit 202 outputs an analog signal AIN to the preamplifier group 203.

The preamplifier group 203 is made up of 3(m+1) number of preamplifiers 203a. The (m+1) number of preamplifiers 203a form one set, and each set of preamplifiers 203a outputs signals to a different folding amplifier 204a. The preamplifiers 203a are controlled by an amplification signal S1.

The folding amplifier group 204 includes (m+1) number of folding amplifiers 204a. Signals output from the three preamplifiers 203a are input to the folding amplifiers 204a, and they output signals to the interpolation circuit 205 and the comparator group 206. The folding amplifiers 204a are controlled by an amplification signal S2.

The interpolation circuit 205 includes 8m number of resistors 205a. The interpolation circuit 205 interpolates output signals of the adjacent folding amplifiers 204a and outputs interpolation signals to the comparator group 206.

The comparator group 206 includes (4m+1) number of comparators 206a. The comparator group 206 compares the signals output from the folding amplifiers 204a with the interpolation signals output from the interpolation circuit 205 and outputs signals to an encoder (not shown) or the like. The comparators 206a are controlled by a clock signal CLK.

Figure 11:
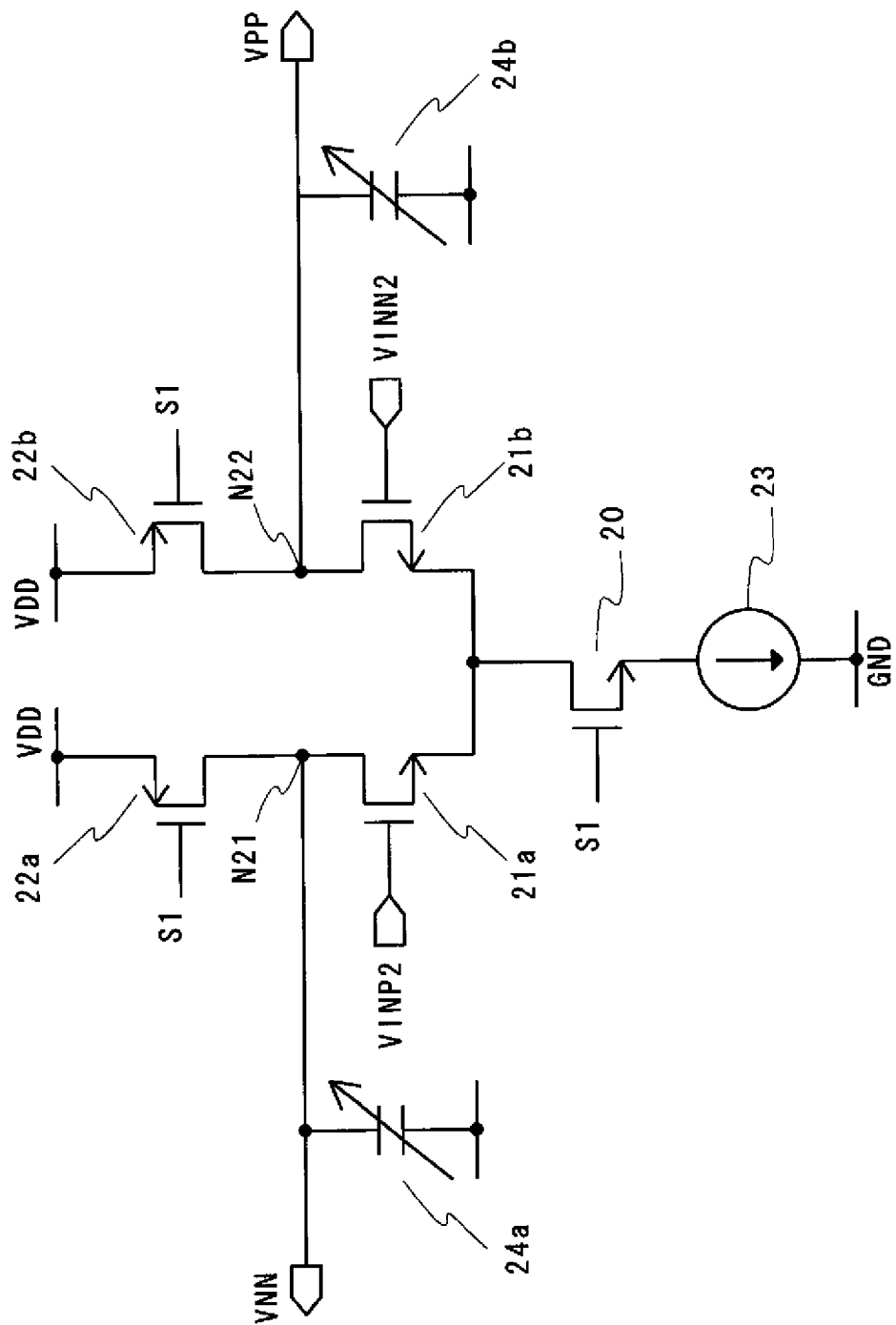
FIG. 11 is a block diagram of a preamplifier according to the second exemplary embodiment.

A configuration of the preamplifier 203a is described hereinafter. FIG. 11 is a block diagram showing a configuration of the preamplifier 203a. In the preamplifier 203a, as shown in FIG. 11, the source of a switch 20 being an Nch transistor is connected to the ground voltage GND through a tail current source 23. The drain of the switch 20 is connected to the sources of Nch transistors 21a and 21b forming a differential pair.

The amplification signal S1 is input to the gate of the switch 20. A gate voltage VINP2 of the Nch transistor 21a is a voltage of the analog signal AIN. A gate voltage VINN2 of the Nch transistor 21b is the reference voltage Vr.

The drain of the Nch transistor 21a is connected to the drain of a Pch transistor 22a through a node N21. The source of the Pch transistor 22a is connected to the power supply voltage VDD.

The drain of the Nch transistor 21b is connected to the drain of a Pch transistor 22b through a node N22. The source of the Pch transistor 22b is connected to the power supply voltage VDD.

The amplification signal S1 is input to the gates of the Pch transistors 22a and 22b.

An output voltage VNN is derived from the node N21. A variable capacitor 24a is connected between the node N21 and the ground voltage GND. Further, an output voltage VPP is derived from the node N22. A variable capacitor 24b is connected between the node N22 and the ground voltage GND.

Figure 12:
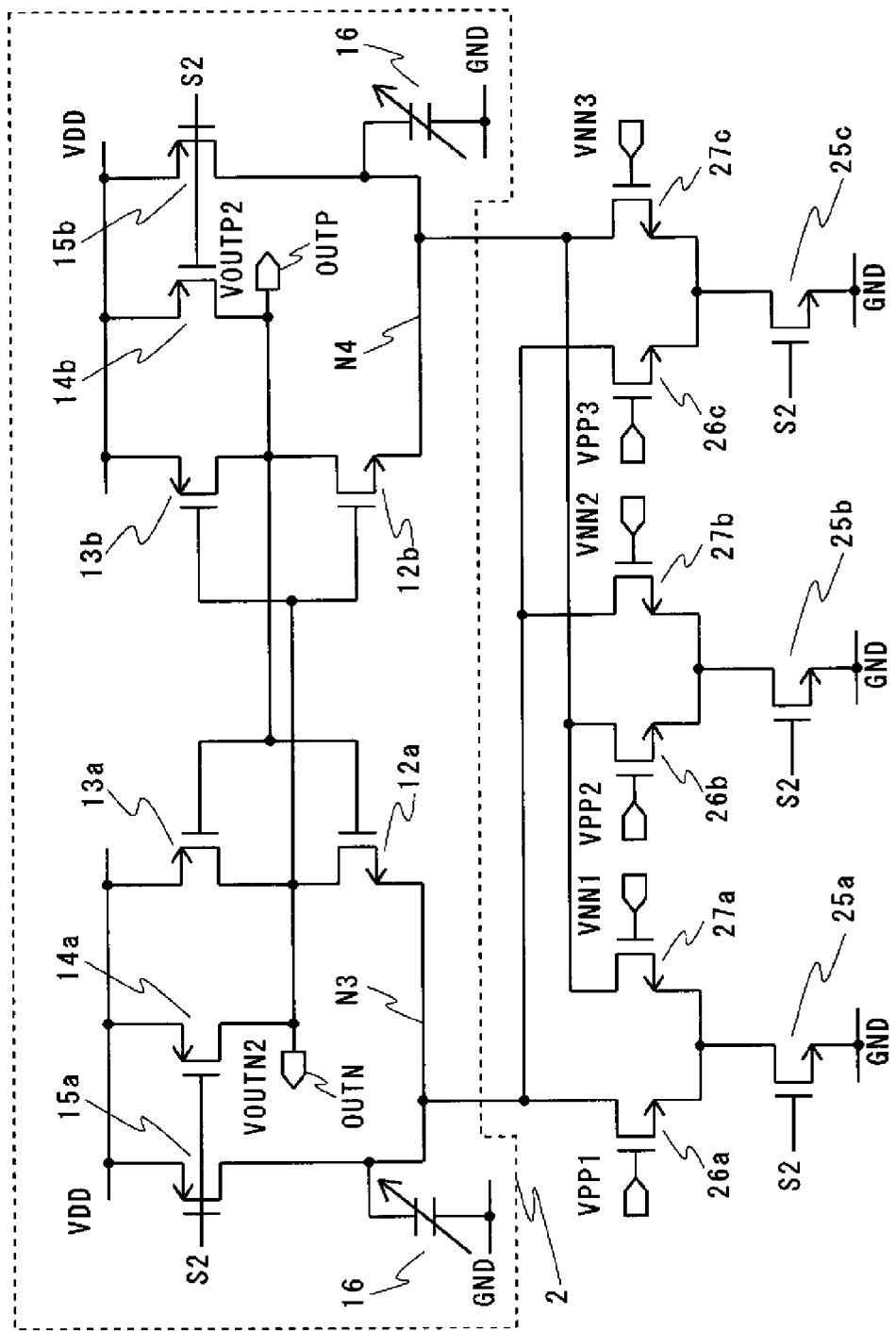
FIG. 12 is a block diagram of a folding amplifier according to the second exemplary embodiment.

A configuration of the folding amplifier 204a is described hereinbelow. FIG. 12 is a block diagram showing a configuration of the folding amplifier 204a. In the folding amplifier 204a, the sources of switches 25a to 25c being Nch transistors are connected to the ground voltage GND as shown in FIG. 12. The drain of the switch 25a is connected to the sources of Nch transistors 26a and 27a. The drain of the switch 25b is connected to the sources of Nch transistors 26b and 27b. The drain of the switch 25c is connected to the sources of Nch transistors 26c and 27c.

The amplification signal S2 is input to the gates of the switches 25a to 25c. Further, output voltages VPP1 to VPP3 that are respectively output from the three preamplifiers 203a are applied to the gates of the Nch transistors 26a to 26c. Output voltages VNN1 to VNN3 that are respectively output from the three preamplifiers 203a are applied to the gates of the Nch transistors 27a to 27c.

The drains of the Nch transistors 26a, 27b and 26c are connected to the node N3. The drains of the Nch transistors 27a, 26b and 27c are connected to the node N4. Thus, two kinds of input signals that are generated based on the signals output from the three different preamplifiers 203a are input to an amplification circuit 2.

In the amplification circuit 2, the output voltage VOUTP1 in the amplification circuit 1 shown in FIG. 2 is replaced with an output voltage VOUTP2, and the output voltage VOUTN1 in the amplification circuit 1 is replaced with an output voltage VOUTN2. Further, the amplification signal S2 is input to the gates of the Pch transistors 14a, 14b, 15a and 15b. The other configuration is the same as that of the amplification circuit 1 shown in FIG. 2 and not redundantly described.

An operation of the folding-interpolating A/D converter is described hereinbelow. First, the preamplifier 203a turns ON when the amplification signal S1 is H level and operates amplification of the input signals. The preamplifier 203a turns OFF when the amplification signal S1 is L level. The preamplifier 203a outputs a signal amplified depending on the input analog signal AIN and the reference voltage Yr. In the preamplifier 203a, like a normal preamplifier, a current flows constantly during the signal amplification.

The folding amplifier 204a amplifies the signal output from the preamplifier 203a and outputs the amplified signal to the interpolation circuit 205 and the comparator group 206 in the subsequent stage. The folding amplifier 204a includes the amplification circuit 2 having a latch circuit made up of the Nch transistors 12a and 12b and the Pch transistors 13a and 13b. Thus, the folding amplifier 204a performs the latch operation when a differential voltage of the input signals is large, and a current does not flow therethrough, just like the preamplifier AMP shown in FIG. 2.

Figure 13:
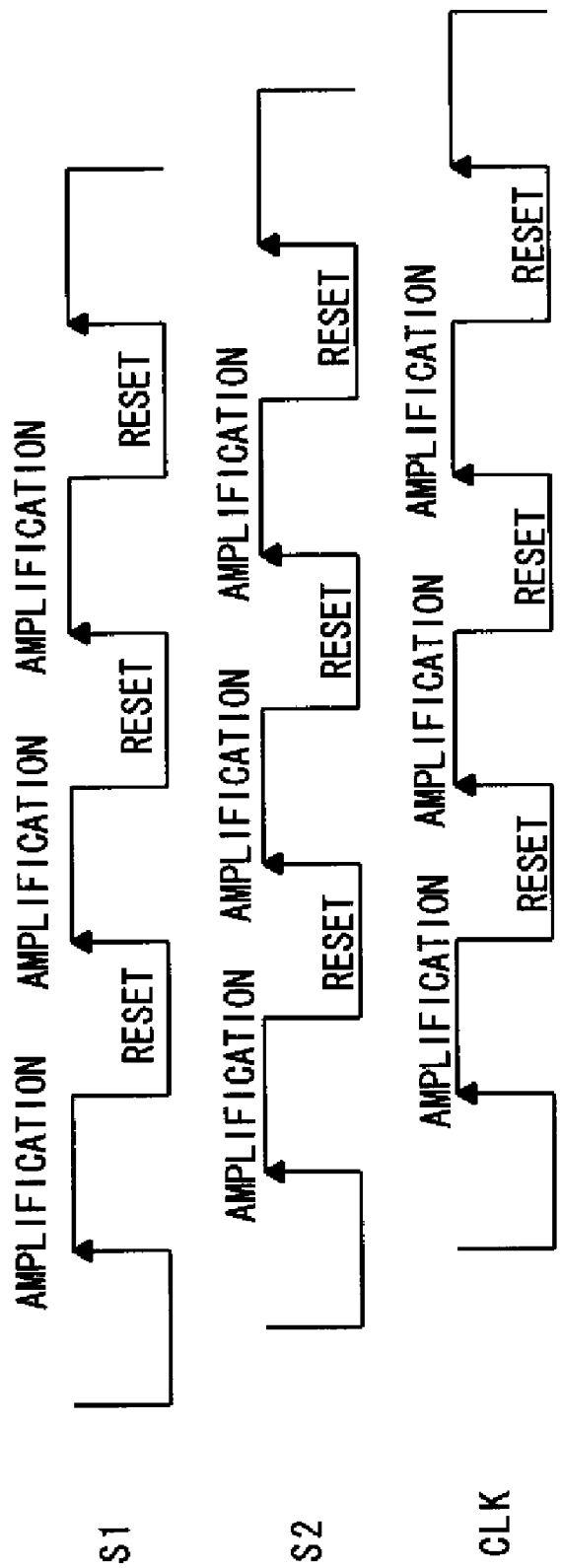
FIG. 13 is a timing chart showing an operation of the interpolating A/D converter according to a second exemplary embodiment.

Further, in the folding-interpolating A/D converter, the respective timings of the amplification signals S1 and S2 and the clock signal CLK are shifted. FIG. 13 is a timing chart showing the timing of a signal amplification of the folding-interpolating A/D converter. Referring to FIG. 13, the rising edge of the amplification signal S2 is delayed compared to the amplification signal S1. Further, the rising edge of the clock signal CLK is delayed compared to the amplification signal S2.

Specifically, the amplification signal S1 rises first, and the preamplifier 203a starts the amplification. After that, the amplification signal S2 rises, and the folding amplifier 204a starts the amplification. Then, the comparator 206a starts the latch operation at the rising edge of the clock signal CLK.

Therefore, after the signal amplification by the preamplifier 203a is performed sufficiently, the signal amplification by the folding amplifier 204a in the subsequent stage is started.

In this configuration, the folding-interpolating A/D converter that can be driven with low power consumption and enables gain adjustment is obtained. Further, a demand for a response speed of the preamplifier 203a can be relaxed. This enables further reduction of power consumption.

Third Exemplary Embodiment

Figure 14:
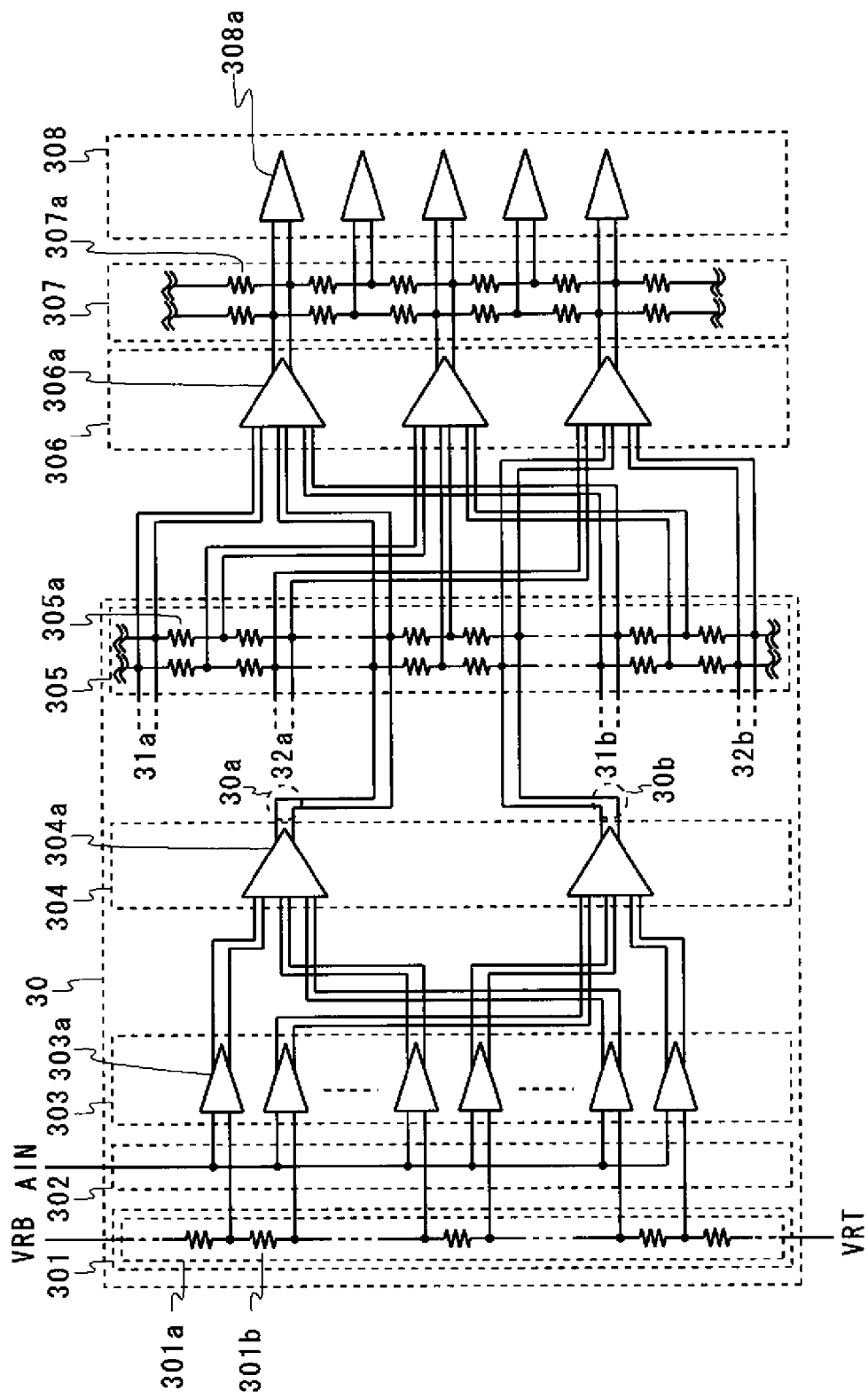
FIG. 14 is a block diagram of an interpolating A/D converter according to a third exemplary embodiment.

A folding-interpolating A/D converter according to a third exemplary embodiment is described hereinbelow. FIG. 14 is a block diagram showing a configuration of a principal part of the folding-interpolating A/D converter according to the exemplary embodiment. Referring to FIG. 14, the folding-interpolating A/D converter includes a reference voltage generation circuit 301, an analog signal input circuit 302, a preamplifier group 303, a first folding amplifier group 304, a first interpolation circuit 305, a second folding amplifier group 306, a second interpolation circuit 307, and a comparator group 308.

The reference voltage generation circuit 301, the analog signal input circuit 302, the preamplifier group 303, the first folding amplifier group 304 and the first interpolation circuit 305 constitute a circuit 30. The circuit 30 includes three sets of output parts 30a to 30c.

In the reference voltage generation circuit 301, a resistor ladder 301a is connected between a maximum reference voltage VRT and a minimum reference voltage VRB. The resistor ladder 301a includes (9j+10) number of resistors 301b, where j is an integer of one or greater. The reference voltage generation circuit 301 generates 9(j+1) kinds of reference voltages and outputs them to the preamplifier group 303.

The analog signal input circuit 302 outputs an analog signal AIN to the preamplifier group 303.

The preamplifier group 303 is made up of 9(j+1) number of preamplifiers 303a. The 3(j+1) number of preamplifiers 303a form one set, and each set of preamplifiers 303a outputs signals to a different folding amplifier 304a. The preamplifiers 303a are controlled by an amplification signal S1.

The first folding amplifier group 304 includes 3(j+1) number of folding amplifiers 304a. Signals output from the three preamplifiers 303a are input to the folding amplifiers 304a, and they output signals to the first interpolation circuit 305 and the second folding amplifier group 306. The folding amplifiers 304a are controlled by an amplification signal S2.

The first interpolation circuit 305 includes 12j number of resistors 305a. The first interpolation circuit 305 interpolates output signals of the adjacent folding amplifiers 304a and outputs interpolation signals to the second folding amplifier group 306. The first interpolation circuit 305 is connected to the output parts 30a and 30b of the circuit 30 and to output parts 31a, 31b, 32a and 32b of other two circuits corresponding to the circuit 30. The output parts 31a and 32a shown in FIG. 14 correspond to the output part 30a in the circuit 30. Likewise, the output parts 31b and 32b correspond to the output part 30b in the circuit 30.

The second folding amplifier group 306 includes 2(j+1) number of folding amplifiers 306a. The second folding amplifier group 306 outputs signals to the second interpolation circuit 307 and the comparator group 308. The folding amplifiers 306a are controlled by an amplification signal S3.

The second interpolation circuit 307 includes 8j number of resistors 307a. The second interpolation circuit 307 interpolates output signals of the adjacent folding amplifiers 306a and outputs interpolation signals to the comparator group 308.

The comparator group 308 includes (4j+1) number of comparators 308a. The comparator group 308 compares the signals output from the folding amplifiers 306a with the interpolation signals output from the second interpolation circuit 307 and outputs signals to an encoder (not shown) or the like. The comparators 308a are controlled by a clock signal CLK.

The preamplifiers 303a have the same configuration as the preamplifiers 203a shown in FIG. 11 and thus are not redundantly described. Further, the folding amplifiers 304a and 306a have the same configuration as the folding amplifier 204a shown in FIG. 12 and thus are not redundantly described.

An operation of the folding-interpolating A/D converter is described hereinbelow. First, the preamplifier 303a turns ON when the amplification signal S1 is H level and operates amplification of the input signals. The preamplifier 303a turns OFF when the amplification signal S1 is L level. The preamplifier 303a outputs a signal amplified depending on the input analog signal AIN and the reference voltage Vr. In the preamplifier 303a, like a normal preamplifier, a current flows constantly during the signal amplification.

Further, in the folding-interpolating A/D converter, just like in the folding-interpolating A/D converter shown in FIG. 10, the folding amplifiers 304a and 306a perform the latch operation when a differential voltage of the input signals is large, and no current flows therethrough.

Figure 15:
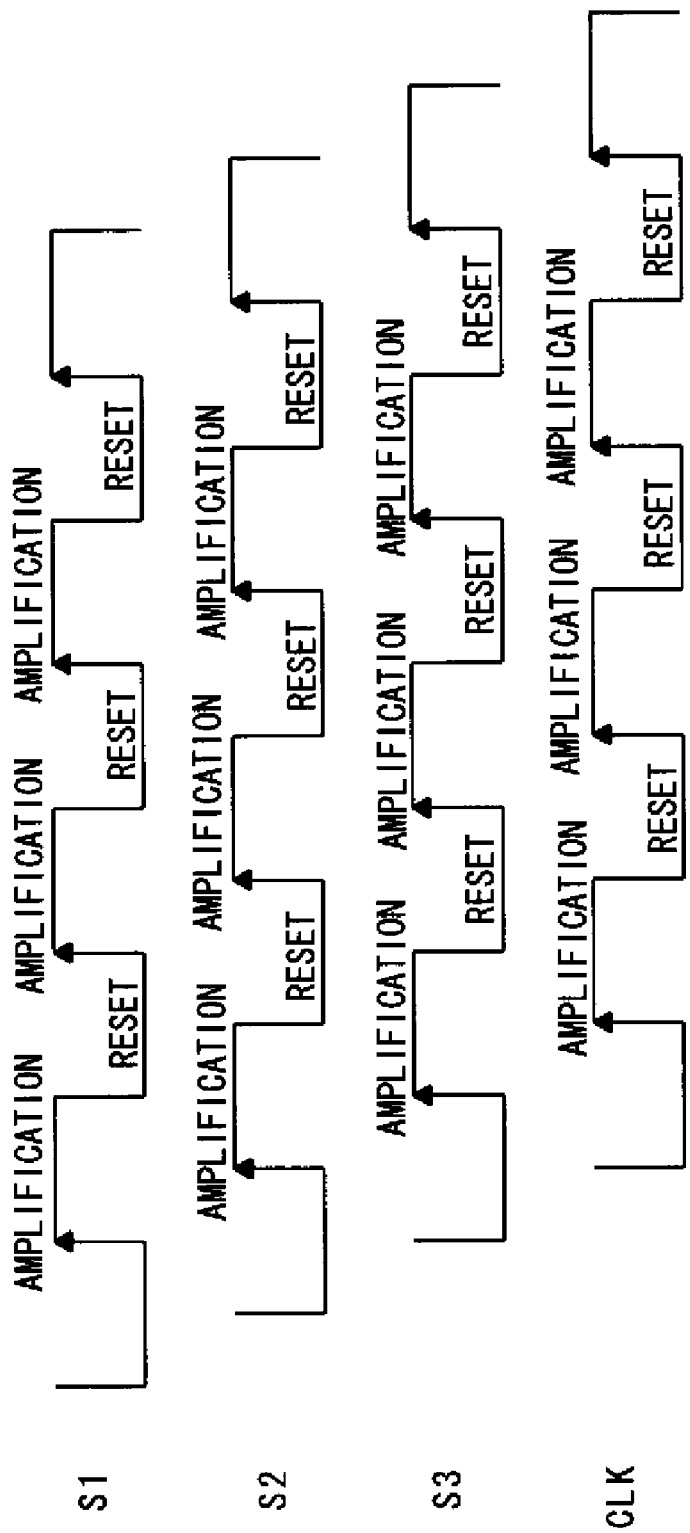
FIG. 15 is a timing chart showing an operation of the interpolating A/D converter according to a third exemplary embodiment.
Figure 16:
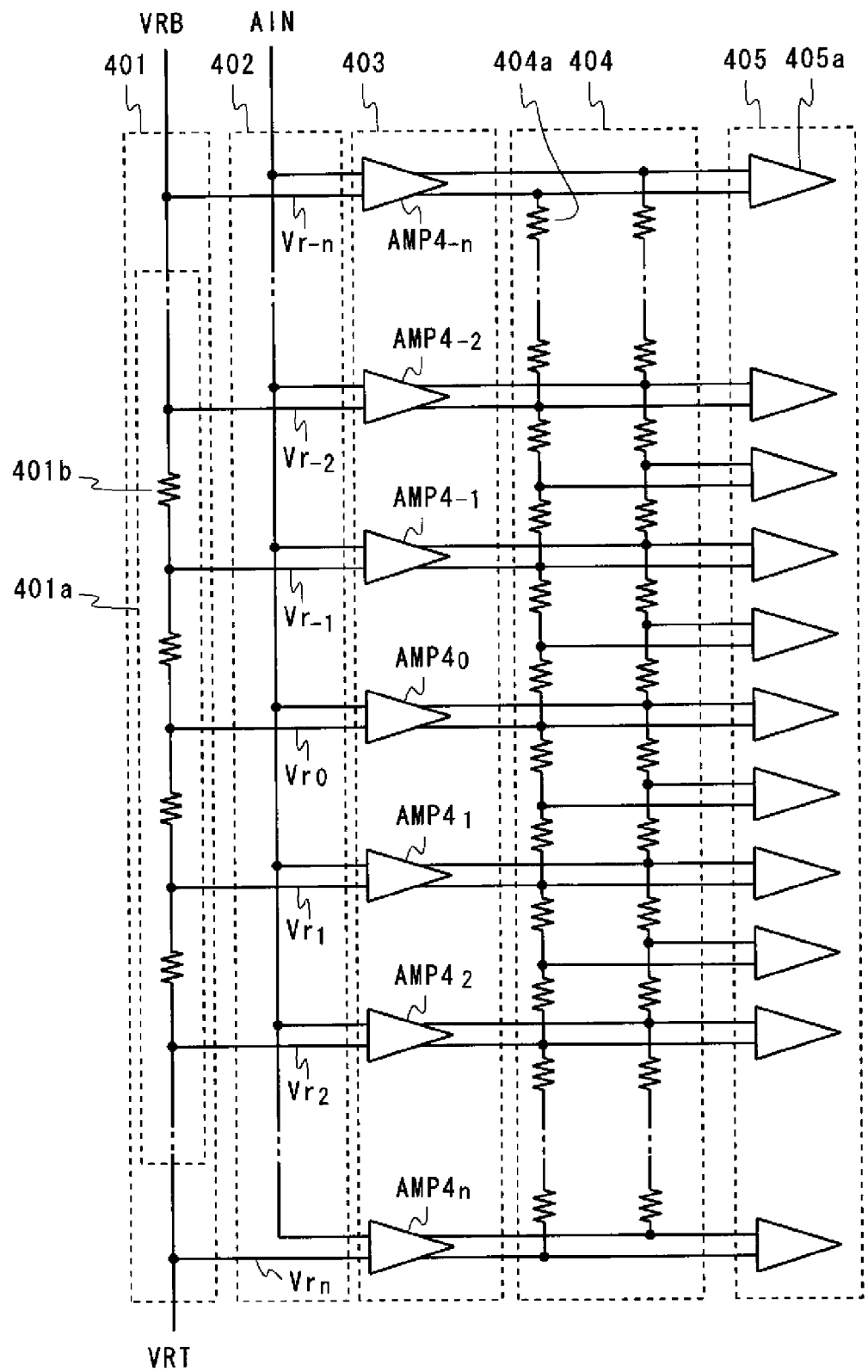
FIG. 16 is a block diagram of a typical interpolating A/D converter.
Figure 17:
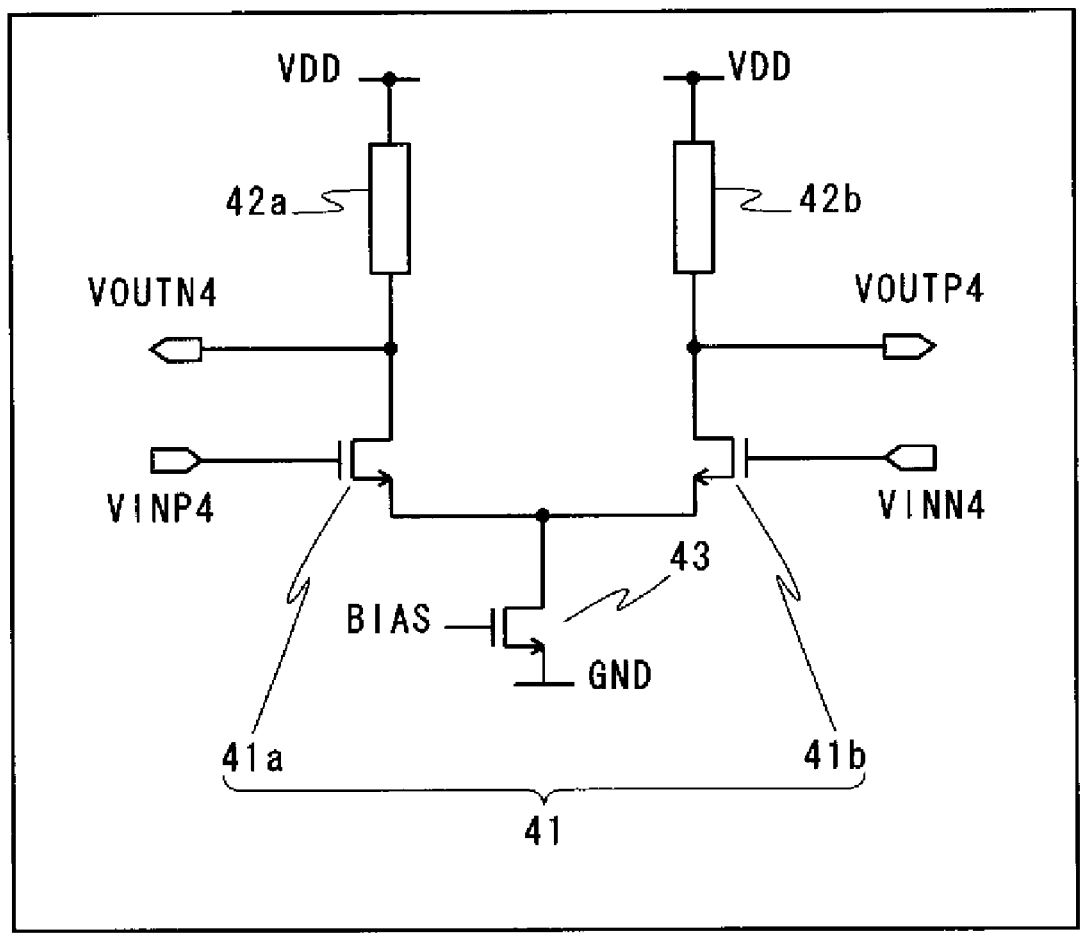
FIG. 17 is a block diagram of a typical preamplifier.
Figure 18:
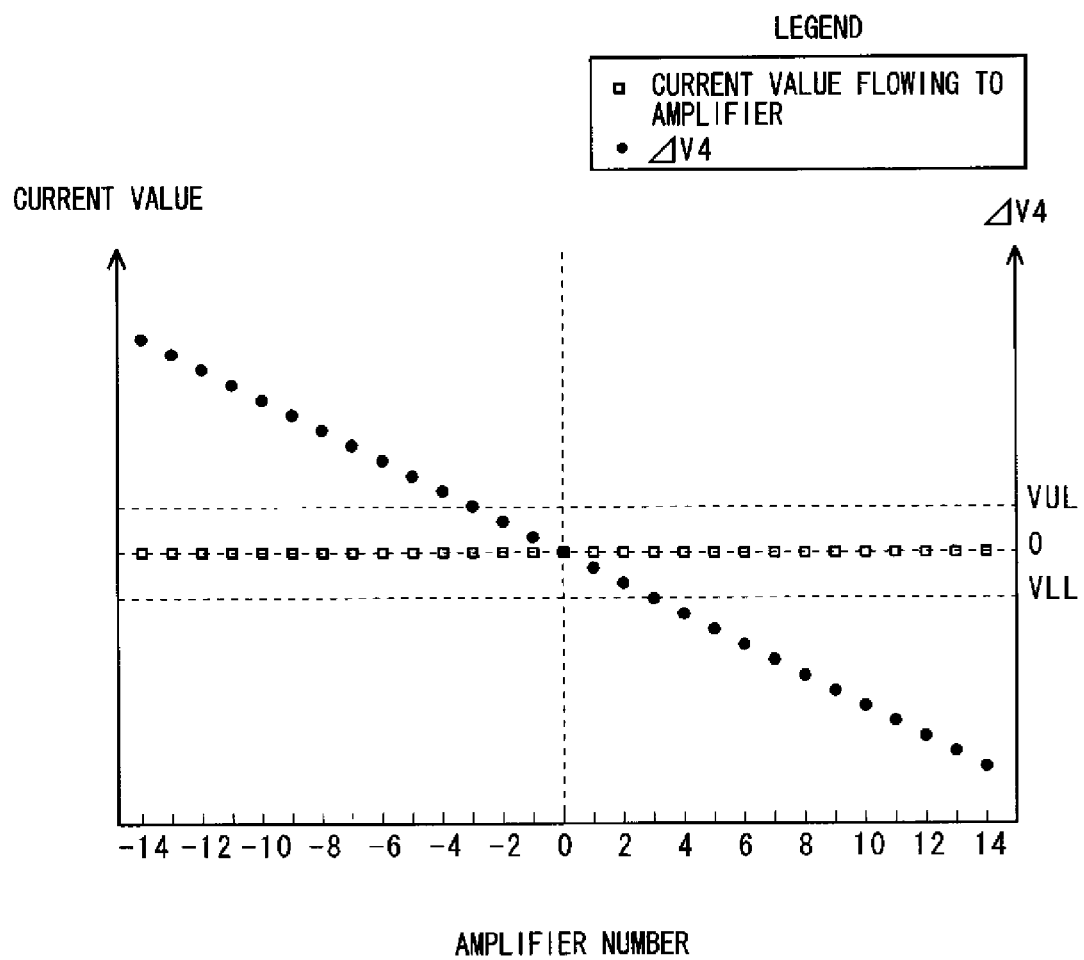
FIG. 18 is a graph showing a relationship between input signals and a current flowing through a preamplifier in the typical interpolating A/D converter.

Further, in the folding-interpolating A/D converter, the respective timings of the amplification signals S1, S2 and S3 and the clock signal CLK are shifted. FIG. 15 is a timing chart showing the timing of a signal amplification of the folding-interpolating A/D converter. Referring to FIG. 15, the rising edge of the amplification signal S2 is delayed compared to the amplification signal S1. The rising edge of the amplification signal S3 is delayed compared to the amplification signal S2. Further, the rising edge of the clock signal CLK is delayed compared to the amplification signal 53.

Specifically, the amplification signal S1 rises first, and the preamplifier 303a starts the amplification. After that, the amplification signal S2 rises, and the folding amplifier 304a starts the amplification. Subsequently, the amplification signal S3 rises, and the folding amplifier 306a starts the amplification. Then, the comparator 308a starts the latch operation at the rising edge of the clock signal CLK.

Therefore, after the signal amplification by the preamplifier 303a is performed sufficiently, the signal amplification by the folding amplifier 304a in the subsequent stage is started.

Further, after the signal amplification by the folding amplifier 304a is performed sufficiently, the signal amplification by the folding amplifier 306a in the subsequent stage is started.

In this configuration, the folding-interpolating A/D converter that can be driven with low power consumption and enables gain adjustment of amplifiers is obtained. Further, a demand for a response speed of the preamplifier 303a and the folding amplifier 304a can be relaxed. This enables further reduction of power consumption.

The present invention is not limited to the exemplary embodiments described above, and various changes may be made without departing from the scope of the invention. For example, although two sets of folding amplifier groups and interpolation circuits are used in the third exemplary embodiment, three or more sets of folding amplifier groups and interpolation circuits may be used.

Further, transistors used in this invention may be field effect transistors such as MOSFET (Metal-Oxide-Semiconductor Field Effect Transistors) or JFET (Junction Field Effect Transistors), or bipolar transistors.

The first to third exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. An interpolating A/D converter comprising:
   an analog signal input circuit that receives an analog signal from outside;
   a reference voltage generation circuit that includes a resistor ladder connected between a maximum reference voltage and a minimum reference voltage and generates reference voltages different from one another;
   an amplifier group that receives the analog signal and the reference voltages, or a first input signal and a second input signal generated based on the analog signal and the reference voltages; and
   an interpolation circuit that interpolates output signals from the amplifier group and outputs an interpolation signal, wherein
   the amplifier group includes a plurality of amplifiers that amplify a differential voltage when a differential voltage between the analog signal and the reference voltages or between the first input signal and the second input signal is smaller than a specified value, and the current flow of which is stopped when the differential voltage is larger than the specified value, and
   the interpolation circuit includes a plurality of resistors that are connected in series between the adjacent amplifiers.

2. The interpolating A/D converter according to claim 1, wherein the amplifier group and the interpolation circuit are placed repeatedly in h (h is an integer of one or greater) number of stages.

3. The interpolating A/D converter according to claim 2, wherein the analog signal and the reference voltages different from one another are input to the plurality of amplifiers in the amplifier group in a first stage.

4. The interpolating A/D converter according to claim 2, wherein
the first input signal input to the amplifier group in an i-th (i is an integer of two or greater) stage is a signal output from the amplifier group in an (i−1)th stage, and
the second input signal is the interpolation signal output from the interpolation circuit in the (i−1)th stage.

5. The interpolating A/D converter according to claim 4, wherein the amplifier group in the i-th stage starts an amplification with a delay from the amplifier group in the (i−1)th stage.

6. The interpolating A/D converter according to claim 1, wherein the current flow of the amplifiers is stopped by performing a latch operation.

7. The interpolating A/D converter according to claim 6, wherein
each amplifier includes a latch circuit made up of a first transistor and a second transistor of a first channel type, and a third transistor and a fourth transistor of a second channel type,
a drain of the first transistor and a drain of the third transistor are connected to each other, and
a drain of the second transistor and a drain of the fourth transistor are connected to each other.

8. The interpolating A/D converter according to claim 7, wherein the first to fourth transistors are MOSFETs (Metal-Oxide-Semiconductor Field Effect Transistors).

* * * * *